United States Patent [19]

Aug et al.

[11] Patent Number: 5,023,754
[45] Date of Patent: Jun. 11, 1991

[54] DOUBLE-SIDED BACKPLANE ASSEMBLY

[75] Inventors: Conrad J. Aug, Preston; Wayne J. Casanova, Rochester; William D. Corfits, Rochester; Roger F. Dimmick, Rochester; Stephen E. Wheeler, Rochester, all of Minn.

[73] Assignee: International Business Machines Corporation, Armonk, N.Y.

[21] Appl. No.: 467,450

[22] Filed: Jan. 19, 1990

[51] Int. Cl.$^5$ .............................................. H05K 7/14
[52] U.S. Cl. .................................. 361/415; 361/397; 361/399; 361/412; 361/413; 361/424
[58] Field of Search ............... 361/393, 394, 397, 412, 361/413, 414, 415, 424; 439/64, 139; 220/22.1, 22.2

[56] References Cited

U.S. PATENT DOCUMENTS 4,876,630 10/1989 Dara ...................................... 361/413
4,900,948 2/1990 Hamilton ............................ 361/413

FOREIGN PATENT DOCUMENTS 3335110 4/1985 Fed. Rep. of Germany ...... 361/415

OTHER PUBLICATIONS

IBM Tech. Discl., "Double-Board Arrangement", F. Tsui et al., 11/70, vol. 13, No. 6.

Primary Examiner—Leo P. Picard
Assistant Examiner—Donald A. Sparks
Attorney, Agent, or Firm—Paul L. Sjoquist

[57] ABSTRACT

A double-sided backplane assembly is provided for increasing the logic element density in a logic cage or CEC. The backplane assembly is multi-layered with a backplane card centrally located between a stiffener and an EMC shield affixed to each side thereof. Connectors for connecting logic elements to the backplane card are provided on both sides of the backplane card, so that a logic cage having two sub-cages may be provided, the two sub-cages sharing the one backplane assembly.

3 Claims, 2 Drawing Sheets

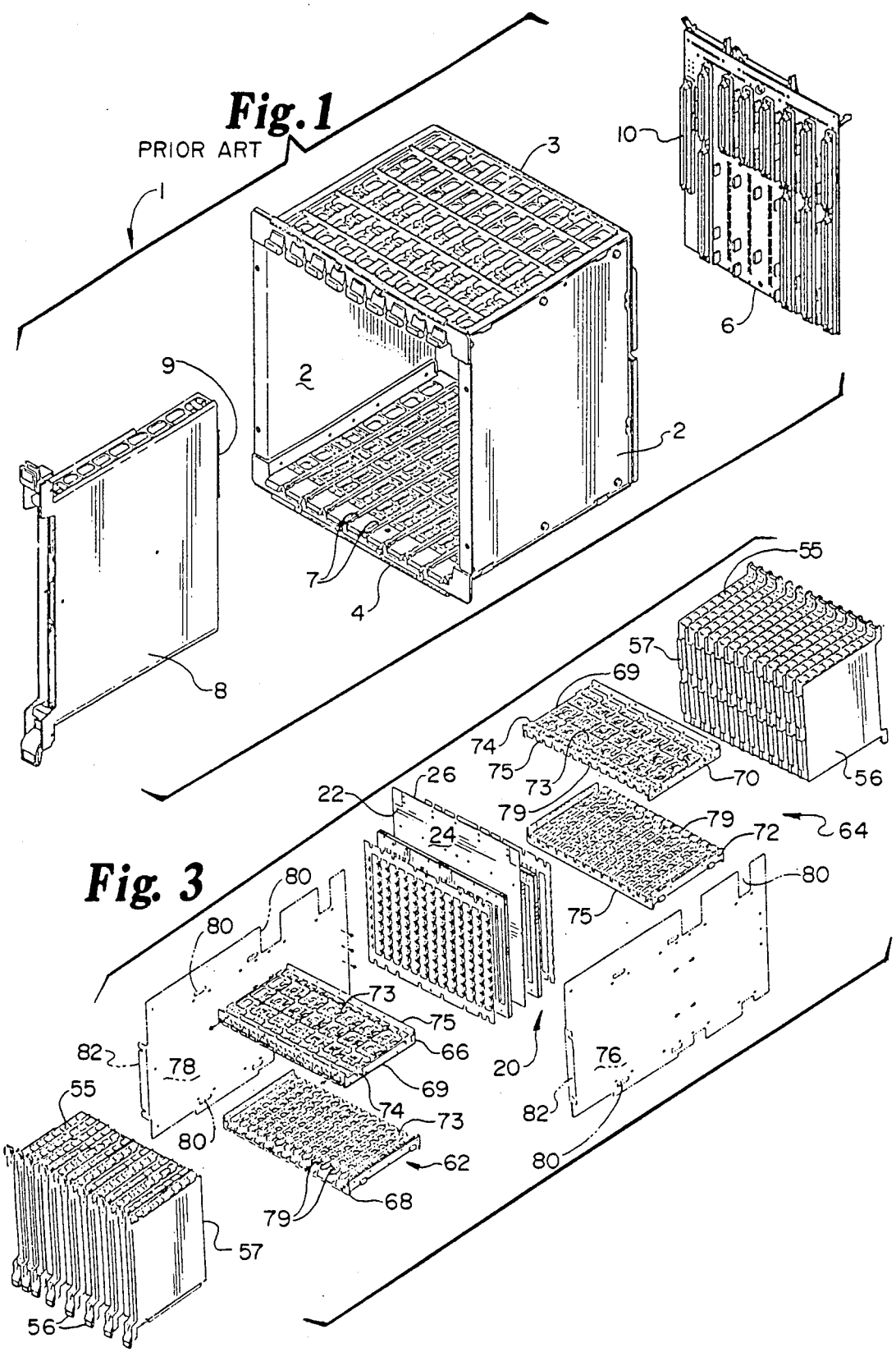

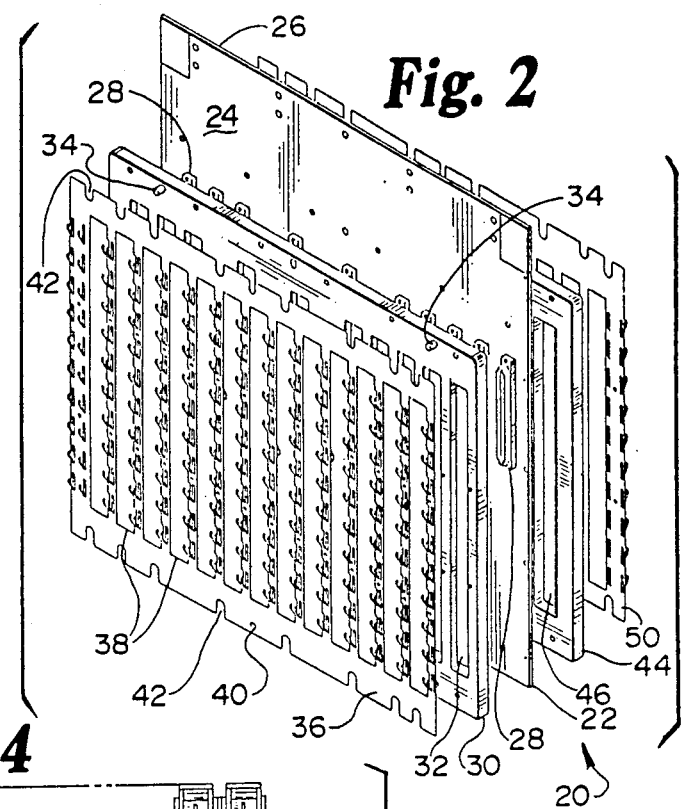

DOUBLE-SIDED BACKPLANE ASSEMBLY

BACKGROUND OF THE INVENTION

This invention relates generally to enclosures for containing logic elements of computing systems and, more specifically, to a double-sided backplane or mother board which enables an enclosure to efficiently handle the increased number of elements.

As computing system evolution has occurred, there have been increases in computing speed, processing power and optional functions. These gains or changes have in turn necessitated larger and increasing numbers of logic elements (e.g., cards or books) required in central electronic complexes (CECs). There are some unsolved problems caused by the greater number of logic elements required.

To a large extent, computing speed is limited by the electrical path length between logic elements. As the number of cards increases and as cards have been made larger, the mechanical pitch or physical distance between cards increases. The increased mechanical pitch equals increased electrical pitch which causes bus length increases and response time increases.

As computing capacity has increased, space has become a premium. A CEC currently needs to be put in smaller, more standard enclosures such as EIA racks. Accommodating the increased card numbers referred to above frequently means resorting to enclosures or logic cages that exceed the horizontal space available in typical racks. Therefore, logic cages must be split and electronically interconnected. Clearly, such "daisy-chaining" of logic cages does nothing to alleviate the electrical path length problem.

As complexity has increased, hardware costs have increased. This is due to the need for multiple cages, additional backplanes or mother boards, added cable, additional connectors, additional cable shielding, etc.

Because a typical CEC wastes significant space in the rack (it is generally much shorter than the rack is deep), an obvious solution would seem to be placing two separate CECs or logic cages back-to-back in a rack. However, this is not practical because the central area where the mother boards or backplanes reside would not be accessible. Further, the CEC to CEC interconnection would not be easily accessible to factory or field personnel. For these reasons, multiple CECs or logic cages typically are mounted one on top of the other, but the result is inefficient use of rack space and inefficient use of hardware.

There have been attempts to address these problems in the prior art. U.S. Pat. Nos. 4,530,033; 4,620,265; 3,668,476 and 3,654,112 are directed to enclosures which might be used to contain logic elements. In particular, U.S. Pat. No. 4,530,033 discloses a single circuit card frame which has molded sidewalls and panels having integral joint and lock means for assembling the frame. However, there is no method suggested to incorporate two frames or cages together. Two additional U.S. Patents which are further representative of prior art enclosures are U.S. Pat. Nos. 4,447,856 and 3,184,645 which are directed to shelf units or separate housings, respectively, wherein the housings or shelf units may be attached together.

SUMMARY OF THE INVENTION

The present invention is directed to and in large part solves the problems discussed so far. A double-sided backplane assembly is provided for increasing the logic element density in a logic cage or CEC. The backplane assembly is multi-layered with a backplane card centrally located between a stiffener and an EMC shield affixed to each side thereof. The double-sided backplane has connectors on both sides for conductively receiving logic elements on both sides so that two logic cages may be integrated, sharing one backplane.

It is a particular advantage of the double-sided backplane of the present invention that logic element packaging efficiency and logic element density are increased.

It is an object of the present invention to provide a double-sided backplane or mother board so that logic elements can be connected to the backplane on both sides.

It is another object of the present invention to provide a single double-sided backplane assembly, wherein the number of logic elements in the space occupied by a typical single logic cage is doubled without increasing the height or vertical space occupied by the logic cage.

It is another object of the present invention to provide a double-sided backplane assembly which reduces the mean electrical path length between logic elements to approximately one-half of the mechanical pitch of the logic elements thereby reducing the signal transmission time and enhancing system performance.

It is another object of the present invention to provide a double-sided backplane assembly for reducing the number of discrete cage-to-cage interconnections.

Further objects, features and advantages of the present invention will be understood with reference to the following specification, the appended drawings and claims.

BRIEF DESCRIPTION OF THE DRAWINGS

FIG. 1 is a partially exploded perspective of a prior art logic cage.

FIG. 2 is an exploded perspective view of the backplane assembly of the present invention.

FIG. 3 is a perspective of the double-sided backplane of the present invention and the double-sided logic cage enabled thereby.

FIG. 4 is a top plan view of the backplane card of the present invention shown in relationship to logic elements aligned as they would be for connection to the backplane card within a double-sided logic cage.

DETAILED DESCRIPTION OF THE PRESENT INVENTION

For illustrative purposes, FIG. 1 depicts a typical prior art logic cage 1. The cage is made up of a pair of sidewalls 2, a top guide 3, a bottom guide 4 and a backplane or mother board 6. Guide slots 7 are provided on the inner surfaces of the guides 3, 4 to receive logic elements 8. The logic elements 8 are provided with connectors 9 adapted to plug into or meet connectors 10 affixed to the backplane 6.

The backplane assembly 20 of the the present invention is depicted in FIG. 2. The assembly 20 includes a double-sided central backplane card or mother board 22 having a front side 24 and a back side 26. A plurality of vertically oriented, parallel logic element connectors 28 are provided on the front side 24 and on the back side 26 (not shown) of the backplane card 22. As will be explained herein below (in conjunction with FIG. 4), connectors 28 on one side 24 of the backplane card 22 are offset with respect to the connectors 28 on the other side 26.

The assembly 20 is made up of a number of components which are affixed to the opposing sides 24, 26 of the backplane card 22. On the front side 24, these components include a stiffener 30. The stiffener 30 supports the backplane card 22 and has openings 32 therethrough for receiving connectors 28 so that the connectors 28 can be connected to logic elements 56 (as shown in FIG. 3). The logic elements 56 are or may be the same as the logic elements 8 in FIG. 1. Stiffener 30 is also provided with locating pins 34 along the top and bottom edges thereof. These pins 34 are provided for aligning or positioning the backplane assembly 20 within the logic cage.

An EMC shield 36 is attached to the stiffener 30. The shield is also provided with openings 38 so that connectors 28 may extend therethrough. Along its periphery, the EMC shield 36 has apertures 40 and notches 42 for alignment and attachment purposes.

The second side 26 of the backplane card 22 is provided with components similar to those mounted on the front side 24. That is, first a stiffener 44, having openings 46 and locating pins 48 (not shown, but similar to pins 54 on stiffener 30), is attached to the backplane card 22. Next to the stiffener 44 an EMC shield 50 with elongated openings is attached. The shield 50 is the same as or similar to the shield 36. As on the backplane card 22 opposite side 24, the openings in both the EMC shield 50 and the stiffener 44 are generally aligned with and are provided to allow connectors 28 located on the back side 26 of the backplane card 22 to protrude so that they may be connected to logic elements 56 (as shown in FIG. 3). The whole backplane assembly 20 as described above may be connected together by conventional mechanical attachment means including screws or rivets and required apertures or connection holes.

FIG. 3 provides an exploded view of backplane assembly 20 of the present invention and a double-sided logic cage 60 enabled thereby.

The layered backplane assembly 20 is centrally located in the double-sided logic cage 60. However, depending on design requirements, e.g., the size of the logic elements, the backplane assembly 20 may be located off-center between the cages. The double-sided cage 60 includes two sub-cages 62 and 64. One of the sub-cages 62 is partially enclosed by a top guide 66 and a bottom guide 68. Likewise, the other sub-cage 64 is provided with a top guide 70 and a bottom guide 72; the guides 66, 68, 70, 72 may be cast or may be formed by other suitable materials or processes. The four guides 66, 68, 70, 72 depicted herein are metal castings having an array of substantially rectangular openings 73 which match the dimensions of openings 55 in the logic elements 56 so that the openings 73 and 55 are in registration when the elements 56 are fully inserted in either one of the sub-cages 62 or 64. An integral bar 75 attaches each guide 66, 68, 70, 72 to the backplane assembly 20 and the sides of the guides are attached to the sidewalls 76, 78. The guides have longitudinal guide slots 79 to guide and support the logic elements 56 in proper position for joining the element connectors 57 to the backplane connectors 28 (not shown in FIG. 3, but see FIG. 2). It should be apparent the guides 66, 68, 70, 72 have each similar characteristics and each ar incorporated similarly into a logic cage 60.

The lateral edges 69 of the guides 66, 68, 70, 72 are provided with tabs 74. The tabs 74 are for positioning sidewalls 76, 78 to complete the enclosure of sub-cages 62, 64. The sidewalls 76, 78 are each formed by a unitary, single piece of sheet metal and are provided with apertures 80 for receiving tabs 74 to align the parts. Sidewalls 76, 78 are secured to the top and bottom guides 66, 68, 70, 72 with screws or other conventional fasteners. The apertures 80 and tabs 74 enable the alignment of the double-sided logic cage 60 in at least three orientations: the cages 62, 64 may be aligned with respect to one another; secondly, the backplane assembly 20 may be aligned as required within the double-sided cage 60; and thirdly, the backplane assembly 20 of the present invention may be aligned with top and bottom guides 66, 68, 70, 72 as required.

The sidewalls 76, 78 have flanges 82 so that they may be mounted or attached to typical racks or support covers if the cage 60 will be used as a stand-alone unit. The apertures 80 may also be used as required for aligning and mounting ancillary equipment or adjunct sheet-metal supports for such ancillary equipment. The double-sided logic cage 60, including sub-cages 62, 64 is adapted to receive a plurality of logic elements 56.

FIG. 4 shows additional details of the backplane card 22 of the backplane assembly 20 and, specifically, how logic elements 56 align therewith. For clarity, the cage structure as identified above has been omitted from FIG. 4. The backplane connectors 28 are of two types: three row and four row, but the scope of the present invention is not specifically limited to these two embodiments of the connectors 28. The mating connectors 57 on the logic elements 56 are also shown.

It should be noted that the logic elements 56 on one side 24 of the backplane card 22 are offset by a specific distance D from the elements 56 on the other side 26 of the backplane card 22.

There are at least two important advantages provided by the offset D. First, it should be apparent that twice the number of logic elements 56 can be mounted to this backplane assembly 20 than could be mounted to a typical prior art single-sided backplane card 6 (FIG. 1). Thus, the mounting factor for logic elements 56 is improved by a factor of 2; twice as many logic elements 56 may be mounted with no increase in the lateral horizontal or vertical space requirements in an enclosure or an EIA rack. Secondly, it should be apparent that the mean electrical path length between the logic elements 56 is reduced to one-half of the mechanical pitch of the logic elements 56 themselves, thereby creating a nearly 50% reduction in the amount of time that elapses between injecting the signal from any logic element 56 to the backplane card 20 and sampling it by the closest opposite element 56.

The transmission time of a signal along any line is determined by the speed of light and the impedance on the line. Reducing the path length creates a nearly directly proportional reduction in transmission time. Slight changes in line impedance prevent the transmission time from being exactly directly proportional to the change in line length and nearly 50% reduction achieved by the present invention is the capability of this system assuming that every other element 56 in what would be a serial string on a typical prior art single-sided backplane card 6 is moved to the other side as in the present invention. Practical limitations on the relation of some logic elements 56 to others 56 may prevent this ideal 50% reduction from being implemented universally, yielding a smaller mean transmission time reduction. However, major performance improvements do result from the reduction of signal transmission time enabled by the double-sided backplane card 22 of the present invention.

With regard to other factors concerning offset distance D, it is determined by the need to accommodate, and may be varied to accommodate, the type of connectors 28 used. It is also intended to minimize the chance that pins 29 protruding through one side 24 of the backplane card 22 interfere with the housings 27 of connectors 28 on the opposite side 26 of the backplane card 22. It should be understood that the offset distance D may be varied depending upon what type or style of connectors 28 are used in a particular application of the double-sided backplane assembly 20 of the present invention.

Connectors 28 may be applied to the backplane card 22 by any of a number of methods including: compliant pin (a mechanically pressed gas-tight design); wave soldering (with applicable masking); solder reflow; or other conventional methods. The installation method used may affect the offset distance D, for example, soldered connections may require different offset due to the need for masking to prevent damage to the connectors to one side of the card while the connectors on the other side are being soldered.

Offset distance D is also provided to maintain clear vias between the connectors 28 on one side 24 of the card 22 and the connectors 28 on the other side 26 of the card 22. This is related to the electrical path length advantage discussed herein above and, in fact, the offset distance D enables vias which comprise interweaving connections between the logic elements 56 and the connectors 28 therefore.

Other advantages attributable to the double-sided backplane include: the memory bus is shorter by approximately 3.6 inches; distribution of power is made possible by plugging the regulators for the logic function directly into the backplane without using cables; and other device containers can be plugged directly into the backplane without external cables, thereby decreasing costs and providing a single ended SCSI bus connection using a minimal amount of the permissible cable length.

The double-sided backplane of the present invention may be embodied in other specific forms without departing from the spirit or essential attributes thereof and the embodiment described herein should be considered as illustrative, not restrictive. Reference should be made to the appended claims rather than the foregoing description to indicate the scope of the invention.

What is claimed:

1. A backplane card for use in a backplane assembly for electronic enclosures used to contain logic elements, said backplane card comprising a printed circuit card having two opposed planar faces, a front face and a rear face, each of said faces having connectors for connecting said backplane card to said logic elements, said connectors on the front face being aligned in discrete spaced apart first rows and having connector conductors extending through said card to said rear face; said connectors on the rear face being aligned in discrete spaced apart second rows and having connector conductors extending through said card to said front face; said first rows being aligned parallel to said second rows and said connectors on the front face being laterally offset a predetermined lateral distance from those connectors on the rear face; said respective front face connectors and said rear face connectors not sharing the same connector conductor.

2. A backplane assembly for use with central electronic enclosures used to contain logic elements, said backplane assembly comprising:
   a. a backplane card having two opposed planar faces, a front face and a rear face, each of said faces having connectors for connecting said backplane card to said logic elements; said connectors on said front face being aligned in parallel spaced apart rows and said connectors on said rear face being aligned in parallel spaced apart rows, said rear face rows being laterally offset from said front face rows; all of said connectors having conductors extending through to the respective opposed planar face without interfering with connectors on said opposed planar face;
   b. two stiffeners, each one of said stiffeners adapted to be affixed in overlying relation to one of said planar faces of said backplane card on either side thereof; each one of said stiffeners having respective slotted openings to receive connectors therthrough;
   c. two EMC shields, each one of said EMC shields having respective slotted openings to align with corresponding slotted openigns in said stiffeners, each EMC shield being overlaid over a respective one of said stiffeners, said connectors being exposed through said stiffeners and said shields.

3. The backplane assembly of claim 2, wherein said stiffeners are provided with a plurality of locating pins along the peripheral edges thereof for locating and securing said backplane assembly in said electronic enclosure.

* * * * *